(12) United States Patent
Kim et al.

(10) Patent No.: US 8,218,117 B2
(45) Date of Patent: Jul. 10, 2012

(54) LIQUID CRYSTAL DISPLAY AND METHOD OF MANUFACTURING THE SAME

(75) Inventors: Hee-Joon Kim, Cheonan-si (KR); Jeong-Eun Park, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 226 days.

(21) Appl. No.: 12/547,426

(22) Filed: Aug. 25, 2009

(65) Prior Publication Data

US 2010/0128192 A1 May 27, 2010

(30) Foreign Application Priority Data

Nov. 25, 2008 (KR) .......................... 10-2008-0117577

(51) Int. Cl.
*G02F 1/1335* (2006.01)
(52) U.S. Cl. ....................................................... 349/141
(58) Field of Classification Search .................... 349/141
See application file for complete search history.

(56) References Cited

U.S. PATENT DOCUMENTS

| 6,128,062 | A * | 10/2000 | Sato | 349/141 |
| 7,522,245 | B2 * | 4/2009 | Kim et al. | 349/141 |
| 7,932,964 | B2 * | 4/2011 | Tanno | 349/43 |
| 2007/0109479 | A1 * | 5/2007 | Kim et al. | 349/141 |
| 2008/0100762 | A1 * | 5/2008 | Onogi et al. | 349/39 |
| 2008/0100787 | A1 * | 5/2008 | Segawa et al. | 349/141 |

* cited by examiner

*Primary Examiner* — James Dudek
(74) *Attorney, Agent, or Firm* — Innovation Counsel LLP

(57) ABSTRACT

An LCD is manufactured to provide a wide viewing angle device and may reduce manufacturing costs according to an embodiment. The LCD includes a substrate, a gate line disposed on the substrate, a gate insulating layer disposed on the gate line, a semiconductor layer disposed on the gate insulating layer, a data line contacting the semiconductor layer, a drain electrode contacting the semiconductor layer and separated from the data line, a pixel electrode contacting the drain electrode, a passivation layer disposed on the pixel electrode, and a common electrode disposed on the passivation layer and including a branch electrode overlapping the pixel electrode. In one embodiment, the pixel electrode contacts an end portion of a thin film transistor. The LCD manufacturing process may be shortened and may save manufacturing costs because the LCD process need not make contact holes to connect the pixel electrode and the TFT.

30 Claims, 7 Drawing Sheets

LIQUID CRYSTAL DISPLAY AND METHOD OF MANUFACTURING THE SAME

CROSS-REFERENCE TO RELATED APPLICATIONS

This application claims priority to Korean Patent Application No. 10-2008-0117577 filed on Nov. 25, 2008 and all the benefits accruing therefrom under 35 U.S.C. §119, the contents of which are herein incorporated by reference in its entirety.

BACKGROUND

1. Technical Field

The present disclosure generally relates to a liquid crystal display (LCD) and a method for manufacturing the same.

2. Related Art

The liquid crystal display (LCD) is one of the most widely used flat panel displays. An LCD may include two panels provided with field-generating electrodes, such as pixel electrodes and a common electrode, and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

An LCD may have a narrow reference viewing angle due to the refractive anisotropy of the liquid crystal. In order to widen the narrow viewing angle, various types of LCDs, such as a patterned vertically aligned (PVA) mode LCD, an in-plane-switching mode LCD, and a plane-to-line switching mode LCD, have been suggested.

BRIEF SUMMARY

In accordance with an embodiment, a liquid crystal display (LCD) may include a substrate; a gate line disposed on the substrate and extended in a first direction; a data line extended in a second direction intersecting the first direction and for supplying data signals; a thin film transistor including a channel region formed in a central portion of the thin film transistor and a drain electrode; a first passivation layer disposed on the data line; a pixel electrode disposed on the first passivation layer and contacting the drain electrode; a second passivation layer disposed on the pixel electrode; and a common electrode disposed on the second passivation layer, wherein the common electrode includes a branch electrode overlapping the pixel electrode.

The thin film transistor may include a gate electrode divided from the gate line; a gate insulating layer disposed on the gate electrode; a semiconductor pattern disposed on the gate insulating layer and overlapping the gate electrode; a source electrode divided from the data line; and a drain electrode disposed on the semiconductor pattern and facing the source electrode. The drain electrode may be overlapped by the pixel electrode entirely. One of either the pixel electrode or the common electrode may include a planar shape, and the other one may include a plurality of linear electrodes and at least one connection portion connecting the plurality of linear electrodes. The plurality of linear electrodes may be slanted toward the gate line. The plurality of linear electrodes may be disposed symmetrically to either side of a hypothetical central line which is parallel to the gate line. The common electrode may shield the data line. The common electrode may be connected to a neighboring common electrode of a neighboring pixel through a connection portion. The common electrode may include a substantially planar shape with a plurality of openings. The LCD may include a storage line formed in the same layer as the gate line or the data line and electrically connected to the common electrode.

A method of manufacturing a liquid crystal display (LCD) may include forming a gate line and a gate electrode on a substrate; forming a gate insulating layer on the gate line; forming a semiconductor pattern located on the gate insulating layer, the semiconductor pattern including a channel region, forming a data line, a source electrode, and a drain electrode on the gate insulating layer; forming a first passivation layer on the data line; forming a pixel electrode contacting the drain electrode, and contacting the first passivation layer; forming a second passivation layer on the pixel electrode; and forming a common electrode on the second passivation layer.

Forming the first passivation layer may include using a slit mask or a halftone mask to pattern the first passivation layer. Forming the first passivation layer on the data line may include forming a photo resist pattern including a first region having a first thickness on the pixel electrode, a second region having a second thickness on the gate electrode, and an opening region on an end portion of the gate line or the data line exposing the first passivation layer, wherein the first thickness is larger than the second thickness; and etching the first passivation layer using the photo resist pattern as an etching mask to expose an end portion of the gate line or data line in the opening region. Forming the source electrode and the drain electrode may include etching the photo resist pattern of the second region to expose the first passivation layer located on a channel region of the semiconductor pattern; and etching the first passivation layer above the channel region. Forming the pixel electrode may further include forming a pixel electrode by depositing a pixel electrode layer; and etching the pixel electrode layer and a data metal layer on the channel region continuously. The source electrode and the drain electrode may be formed after depositing the pixel electrode layer and patterning the pixel electrode layer and data metal layer on the channel region. The drain electrode may be entirely overlapped by the pixel electrode.

BRIEF DESCRIPTION OF THE DRAWINGS

Embodiments can be understood in more detail from the following description taken in conjunction with the accompanying drawings, in which.

DETAILED DESCRIPTION

Embodiments of the invention will be described below with reference to the accompanying drawings, in which examples of embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
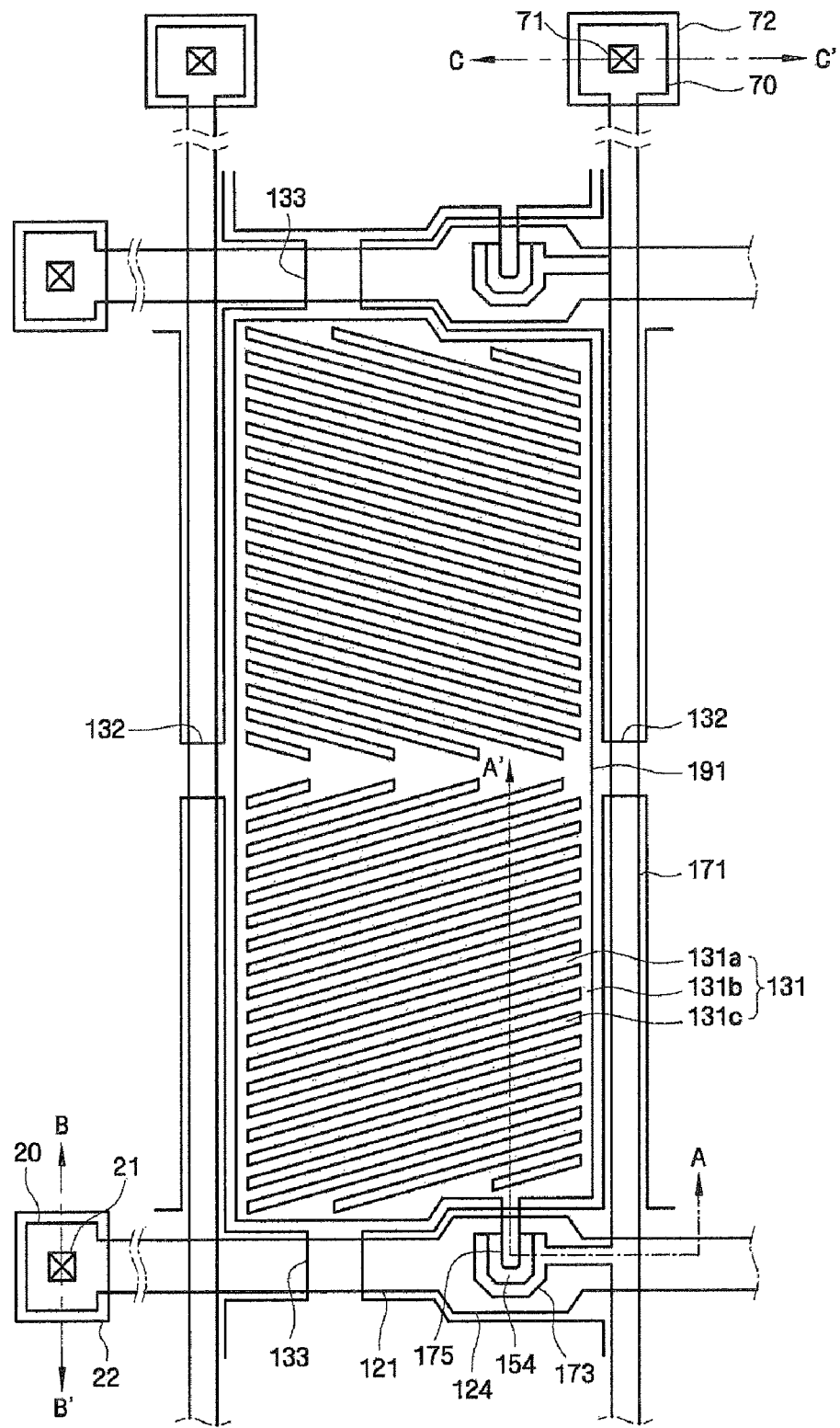
FIG. 1 is a plan view of a liquid crystal display in accordance with an embodiment.
Figure 2:
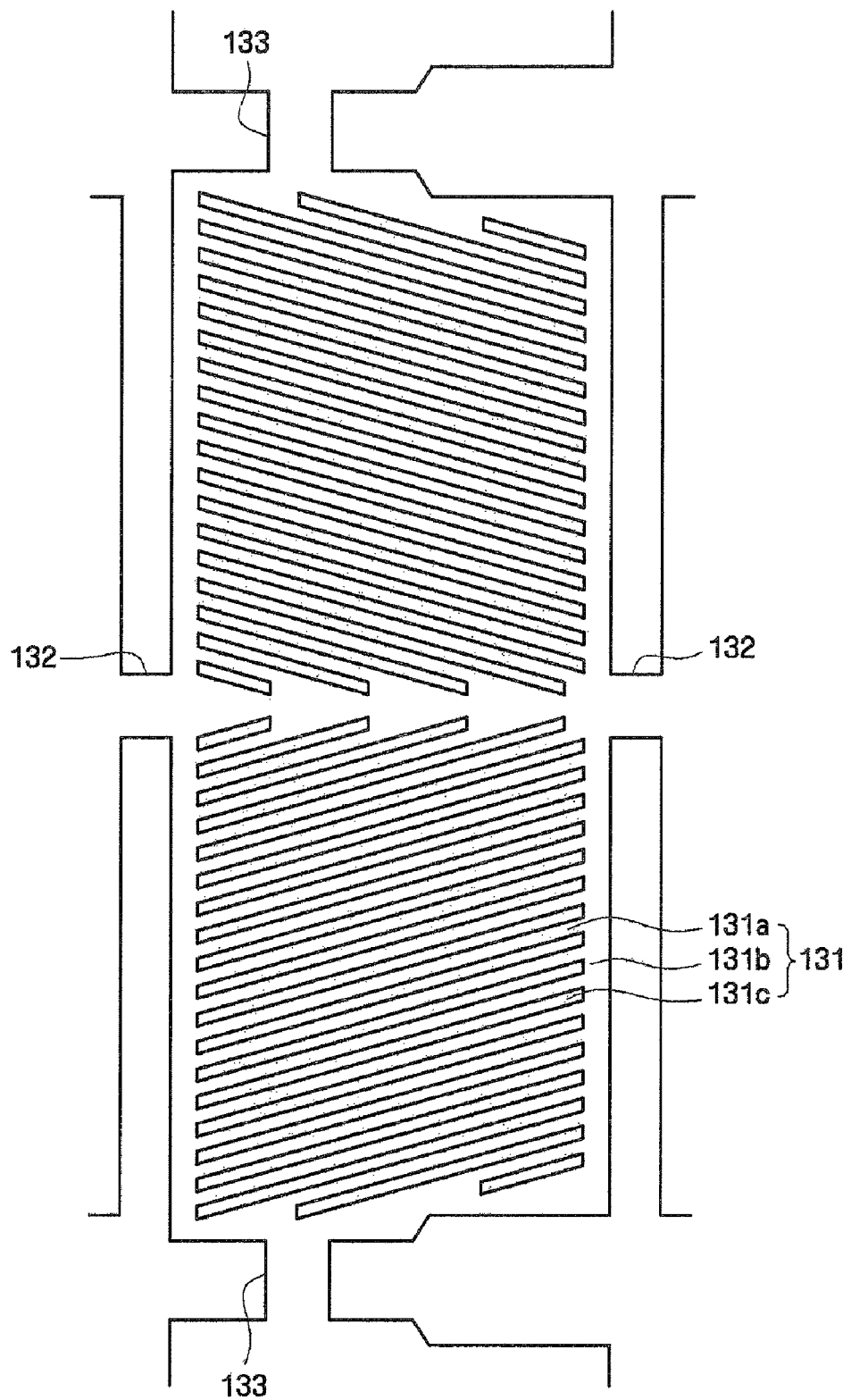
FIG. 2 is a plan view of a common electrode of the liquid crystal display in accordance with an embodiment.
Figure 3:
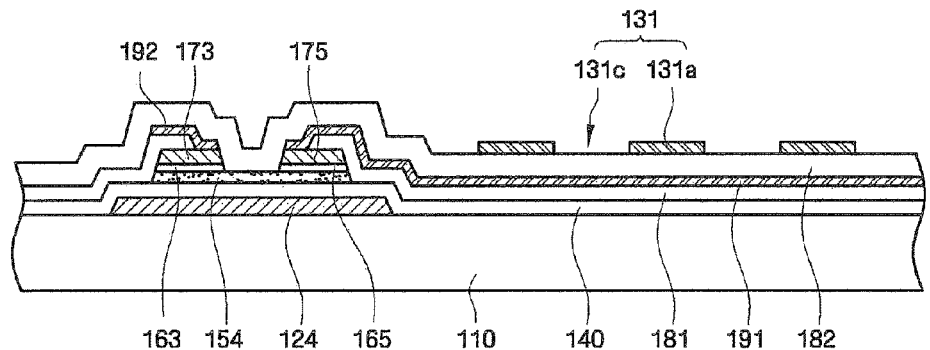
FIG. 3 is a cross-sectional view taken along line A-A' of FIG. 1 in accordance with an embodiment.

FIG. 1 is a plan view of a liquid crystal display in accordance with an embodiment. FIG. 2 is a plan view of a common electrode of the liquid crystal display in accordance with an embodiment. FIG. 3 is a cross-sectional view taken along line A-A' of FIG. 2 in accordance with an embodiment. A plurality of gate lines 121 is formed on an insulating substrate 110 such as transparent glass or plastic. A plurality of gate electrodes 124 is formed as a protrusion shape from the gate line 121. Referring, for example, to FIG. 1, each of the gate lines 121 includes a plurality of gate electrodes 124 projecting upward and downward and an end portion 20 having a large area for contact with another layer or an external driving circuit. The plurality of gate lines 121 may be made of Al containing metal such as Al and Al alloy, Ag containing metal such as Ag and Ag alloy, Cu containing metal such as Cu and Cu alloy, Mo containing metal such as Mo and Mo alloy, Cr, Ta, or Ti.

The gate lines 121 may have a multi-layered structure including at least two conductive films (not shown) having different physical characteristics. One of the two films may be made of low resistivity metal including, for example, Al containing metal, Ag containing metal, and Cu containing metal for reducing signal delay or voltage drop. The other film may be made of material such as Mo containing metal, Cr, Ta, or Ti, which has good physical, chemical, and electrical contact characteristics with other materials such as indium tin oxide (ITO) or indium zinc oxide (IZO). Examples of the combination of the two films are a lower Cr film and an upper Al (or Al alloy) film and a lower Al (or Al alloy) film and an upper Mo (or Mo alloy) film. However, it is to be understood that the gate lines 121 may be made of various metals or conductors.

A plurality of common electrode lines may be formed on the same layer as the plurality of gate lines 121 and connected to a common electrode 131 located on the upper layer so that the resistivity may be decreased. The common electrode line may be formed on the same layer, for example, as a plurality of data lines 171.

A gate insulating layer 140 made, for example, of silicon nitride (SiNx) or silicon oxide (SiOx) is formed on the gate lines 121.

A plurality of semiconductor patterns 154 made, for example, of hydrogenated amorphous silicon (abbreviated to "a-Si") or polysilicon is formed on the gate insulating layer 140. The plurality of semiconductor patterns 154 is disposed between the gate electrodes 124 and the data lines 171, and the semiconductor patterns 154 may include extensions covering boundaries of the gate lines 121.

A plurality of pairs of ohmic contact patterns 163, 165 are formed on the semiconductor patterns 154. The ohmic contact patterns 163, 165 are made, for example, of silicide or n+ hydrogenated a-Si heavily doped with n type impurity such as phosphorous. The ohmic contact patterns 163, 165 are formed in pairs and disposed on the semiconductor patterns 154. The ohmic contact patterns 163, 165 improve the contact property between source electrode 173 and the semiconductor pattern 154 and the contact property between drain electrode 175 and the semiconductor pattern 154. The data lines 171, drain electrodes 175, and source electrodes 173 are formed on ohmic contact patterns 163, 165 and on the gate insulating layer 140.

The drain electrodes 175 are separate from the data lines 171 and disposed opposite to the source electrodes 175 with respect to the gate electrodes 124. The source electrode is formed of a branch portion of a data line and extended on the semiconductor pattern 154. The thin film transistor (TFT) includes a gate electrode 124, a source electrode 173, a drain electrode 175, and a semiconductor pattern 154. A channel of the TFT is formed between the source electrode 173 and the drain electrode 175. A plurality of data lines 171 and a plurality of drain electrodes 175 are formed on the ohmic contacts 163 and 165 and the gate insulating layer 140.

The data lines 171 may transmit data signals and extend substantially in the longitudinal direction to intersect the gate lines 121. The data lines 171 and the drain electrodes 175 may be made of refractory metal such as Cr, Mo, Ta, Ti, or alloys thereof. The data lines 171 and the drain electrodes 175 may have a multilayered structure including a refractory metal film (not shown) and a low resistivity film (not shown). Examples of the multi-layered structure are a double-layered structure including a lower Cr/Mo (alloy) film and an upper Al (or Al alloy) film and a triple-layered structure of a lower Mo (or Mo alloy) film, an intermediate Al (or Al alloy) film, and an upper Mo (or Mo alloy) film. However, it is to be understood that the data lines 171 and the drain electrodes 175 may be made of various metals or conductors.

A first passivation layer 181 is formed on the data lines 171, the drain electrode 175 and the semiconductor pattern 154. The first passivation layer 181 may be open on a portion of the drain electrode 175 and a portion of the source electrode 173. The first passivation layer 181 may be made of an inorganic insulator such as silicon nitride or silicon oxide.

The pixel electrodes 191 occupy most of the areas enclosed by the gate lines 121 and the data lines 171. In accordance with an embodiment, the pixel electrodes 191 are formed on the first passivation layer 181 and are connected to the drain electrodes 175 through an opening of the first passivation layer 181. The pixel electrodes 191 are connected to the portion of drain electrode 175 close to the channel region of the TFT formed between the source electrode 173 and the drain electrode 175. The contact holes 71, 21 are formed on the end portion 70 of the data lines and on the end portion 20 of the gate lines.

In this embodiment, the pixel electrodes 191 are formed in a plane shape and do not include any empty spaces or openings therein. The pixel electrodes 191 are spaced apart from the data lines 171 and the subsidiary data lines (not shown). The pixel electrodes 191 directly contact the drain electrodes 175. The pixel electrodes 191 may be made of a transparent conductor such as polycrystalline, single-crystalline, or amorphous ITO or IZO.

A second passivation layer 182 is formed on the pixel electrodes 191 and made of an inorganic insulator such as silicon nitride or silicon oxide. A common electrode 131 is formed on the second passivation layer 182 and made of a transparent conductor such as polycrystalline, single-crystalline, or amorphous ITO or IZO.

The common electrode 131 includes a plurality of branch electrodes 131a and a plurality of connecting portions 131b. A plurality of cutouts 131c is formed between the branch electrodes 131a. Referring to FIG. 1, for example, the cutouts 131c and the branch electrodes 131a are arranged symmetrically with respect to a center transverse line bisecting the branch electrodes 131a (e.g., as a group) into upper and lower halves. The cutouts 131c and the branch electrodes 131a in the upper half of the branch electrodes are substantially parallel to each other, and similarly, those in the lower half of the branch electrodes are substantially parallel to each other. Accordingly, the cutouts 131c and the branch electrodes 131a in the upper half and the lower half of the branch electrodes make an oblique angle.

The plurality of common electrodes 131 are connected to each other through a first and a second connection portion of common electrodes 132, 133. The first connection portion 132 intersects the data lines 171 and the second connection portion 133 intersects the gate lines 121.

The horizontal component of the electric field may rotate liquid crystal molecules (not shown) on a plane parallel to the surface of the TFT array panel. The liquid crystal molecules are contained in a liquid crystal layer (not shown) disposed on the field generating electrodes 131 and 191 (e.g., the common and pixel electrodes). In addition, the vertical component of the electric field may tilt the liquid crystal molecules up or down. The orientations of the liquid crystal molecules determined by the electric field in turn determine the polarization of light passing through the liquid crystal layer, thereby determining the light transmittance.

Since the long axes of the liquid crystal molecules are distributed in multiple directions, the reference viewing angle of the LCD including the TFT array panel is wide. In addition, since both the horizontal component and the vertical component of the electric field contribute to displaying an image, the aperture ratio and the light transmittance of the LCD is relatively high, particularly for a transmissive LCD where the pixel electrodes 191 and the common electrode 131 including the branch electrodes 131a and the connecting portions 131b are transparent.

A method of manufacturing the TFT array panel according to an embodiment of the present invention shown in FIG. 1 and FIG. 3 will be described with reference to FIG. 4A through FIG. 4N. FIG. 3 is a cross-sectional view taken along line A-A' of FIG. 1 according to an embodiment. Vertical views of a manufacturing process of a thin film transistor (TFT) substrate in FIG. 1 will be described in FIG. 4A through FIG. 4N showing the vertical cross sectional views through A-A', B-B', C-C' in FIG. 1.

Figure 4A:
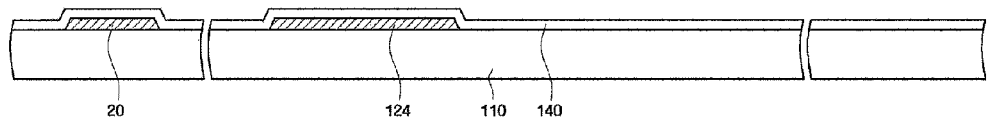
FIG. 4A through FIG. 4N are sequential cross-sectional views illustrative of manufacturing a liquid crystal display in accordance with one or more embodiments.

Referring to FIG. 1 and FIG. 4A, a conductive layer for formation of a gate is deposited on an insulating substrate 110 such as plastic or glass by sputtering and patterned by lithography and etching to form a plurality of gate lines 121 including gate electrodes 124 and end portions 20. A common voltage line (not shown) may be formed on the same layer as gate lines 121. A gate insulating layer 140 having a thickness ranging from about 1,500 Å to about 5,000 Å is deposited on the substrate 110.

Figure 4B:
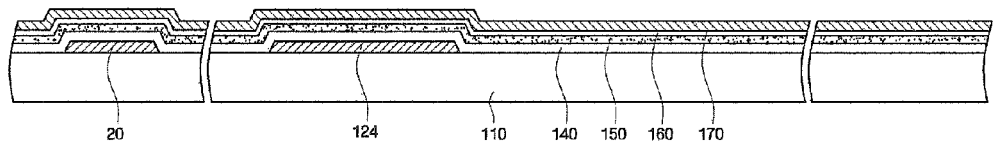

Referring to FIG. 1 and FIG. 4B, semiconductor layer 150 having a thickness ranging from about 500 Å to about 2,000 Å, ohmic contact layer 160 having a thickness ranging from about 300 Å to about 600 Å, and a conductive layer for data lines 170 are sequentially deposited.

Figure 4C:
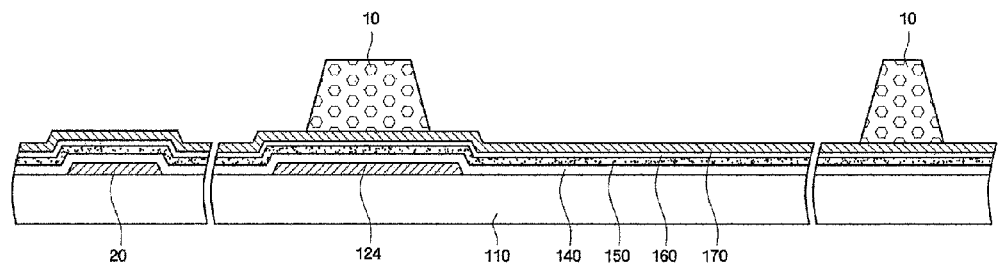
Figure 4D:
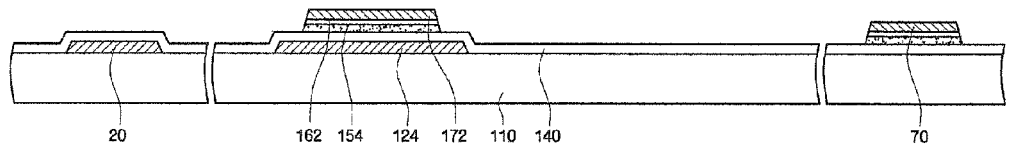

Referring to FIG. 1, FIG. 4C and FIG. 4D, the conductive layer for data lines 170, ohmic contact layer 160, and semiconductor layer 150 are patterned by lithography and wet etching or dry etching—using photo resist patterns 10, for example—to form a plurality of data layer patterns 172, ohmic contact pattern 162 and semiconductor pattern 154. The data layer patterns 172 may be made into source electrodes 173 and the drain electrodes 175 thereafter. The data layer patterns 172 are not patterned to be a source electrode and a drain electrode in this stage of the process. In other words, the source electrode 173 and the drain electrode 175 are not formed yet and remain as one body. The data layer patterns 172 and the semiconductor patterns 154 are not separated and are substantially aligned with one another.

Figure 4E:
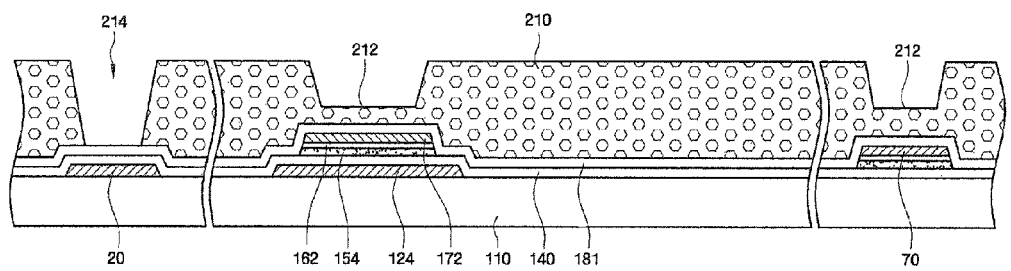

Referring to FIG. 1 and FIG. 4E, a first passivation layer 181 is deposited on the data layer patterns 172, the photo resist patterns 210, 212, 214 are formed on the first passivation layer 181. The photo resist patterns 210, 212, 214 may include three regions having different thicknesses.

The first region 210 is formed on the data lines 171, the gate lines 121 and pixel regions. The second region 212 which is thinner than the first region 210 is formed on the gate electrode 124 and an end portion of the data lines 70. The third region 214 is formed on the gate end portions 20. The photo resist patterns 210, 212, 214 having different thicknesses may be formed, for example, by using a slit mask or a halftone mask. In the third region 214, the gate insulating layer 140 and the first passivation layer 181 are exposed.

Figure 4F:
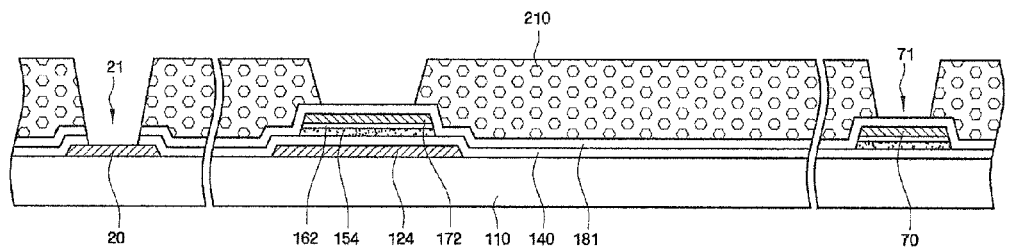

Referring to FIG. 1 and FIG. 4F, the photo resist on the second region 212 is removed by etching or etch-back process, and the first passivation layer 181 above the semiconductor pattern 154 and the data end portion 70 is exposed. The thickness of photo resist on the first region 210 is also decreased. The exposed gate insulating layer 140 and the first passivation layer 181 is etched in the third region 214.

Figure 4G:
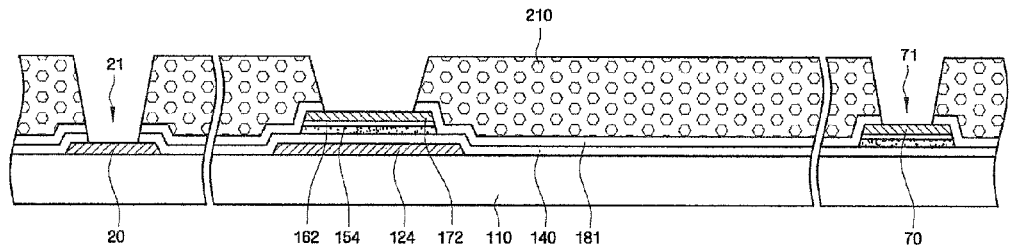

Referring to FIG. 1 and FIG. 4G, the photo resist patterns 210 are used as a mask for etching, and the first passivation layer 181 on the data layer patterns 172 and end portions 70 of data lines 171 is removed.

Although the method of etching the first passivation layer 181 and the gate insulating layer 140 on the gate end portion 20 and the first passivation layer 181 on the data end portion 70 using the photo resist patterns 210, 212, 214 having different thicknesses from FIG. 4E to FIG. 4G have been described hereinabove, it should be understood that the present invention is not limited to these embodiments, but may be modified by those skilled in the art without departing from the spirit and scope of the present invention, as defined in the appended claims.

Figure 4H:
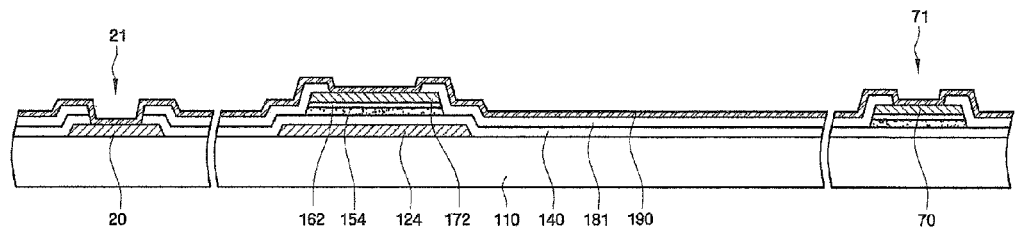
Figure 4I:
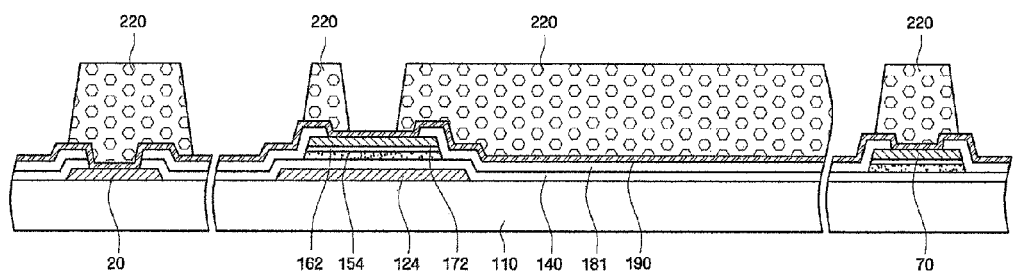

Referring to FIG. 1, FIG. 4H and FIG. 4I, a pixel conductive layer 190 is formed after removing the photo resist pattern 210. A photo resist pattern 220 has openings exposing the pixel conductive layer 190 on the channel region.

Figure 4J:
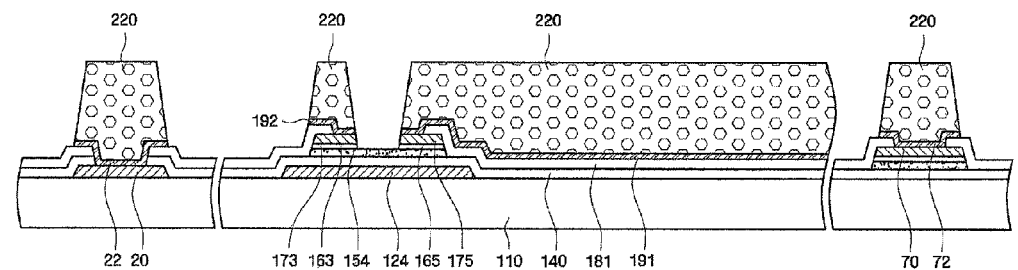

Referring to FIG. 1 and FIG. 4J, a photo resist pattern 220 is used as an etching mask for etching the pixel conductive layer 190 for pixel electrode 191. The sub-source electrode 192 and pixel electrode 191 are formed by etching. A source electrode 173, a drain electrode 175, and ohmic contact patterns 163, 165 are formed by etching the data conductive pattern 172 on the TFT channel region and the ohmic contact layer 162. A portion of source electrode 173 is covered with the first passivation layer 181, and the other portion of source electrode 173 is connected to the sub-source electrode 192. A portion of drain electrode 175 is covered with the first passivation layer 181, and the other portion of drain electrode 175 is connected to the pixel electrode 191. The drain electrode 175 is patterned and substantially overlapped by the pixel electrode 191.

In the embodiment shown, the masking process forming the semiconductor pattern 154 and the masking process forming the source electrode 173 and the drain electrode 175 are not different. Thus, the processes of forming semiconductor pattern 154 and forming the source electrode 173 and the drain electrode 175 are self-aligned and may reduce the light-leakage current.

Figure 4K:
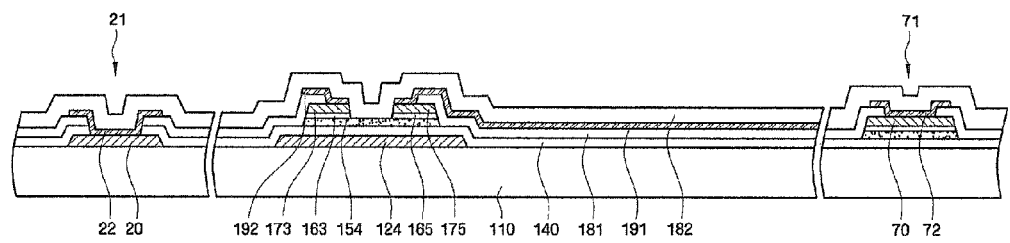

Referring to FIG. 1 and FIG. 4K, the photo resist pattern 220 is removed, and then the second passivation layer 182 is deposited.

Figure 4L:
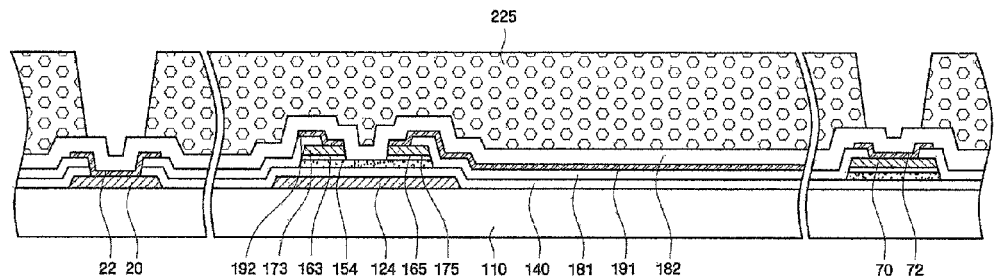

Referring to FIG. 1 and FIG. 4L, after forming a photo resist pattern 225 on the second passivation layer 182, a portion of the second passivation layer 182 is etched to expose a portion of gate pad 22 and a portion of a data pad 72 by using the photo resist pattern 225 as a mask for etching.

Figure 4M:
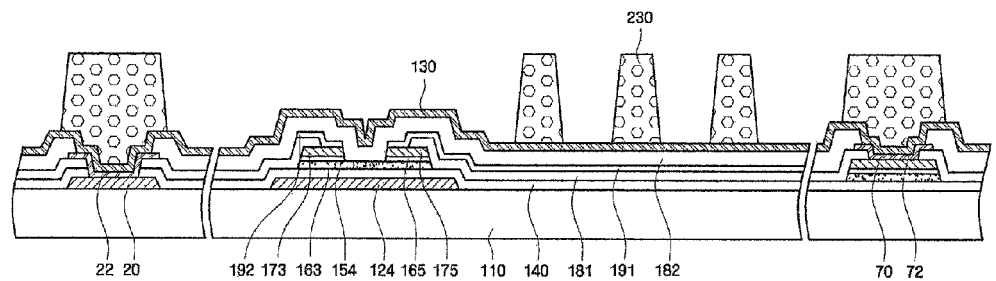
Figure 4N:
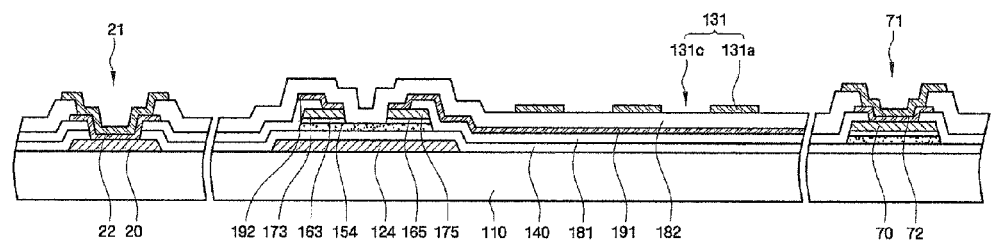

Referring to FIG. 1 and FIG. 4M, a common electrode conductive layer 130 is deposited and a common electrode photo resist pattern 230 is formed.

Referring to FIG. 1 and FIG. 4N, the common electrode conductive layer 130 is patterned to form a common electrode 131. The common electrode 131 includes a plurality of branch electrodes 131a and a plurality of connecting portions 131b. A plurality of cutouts 131c is formed between the branch electrodes 131a.

Figure 5:
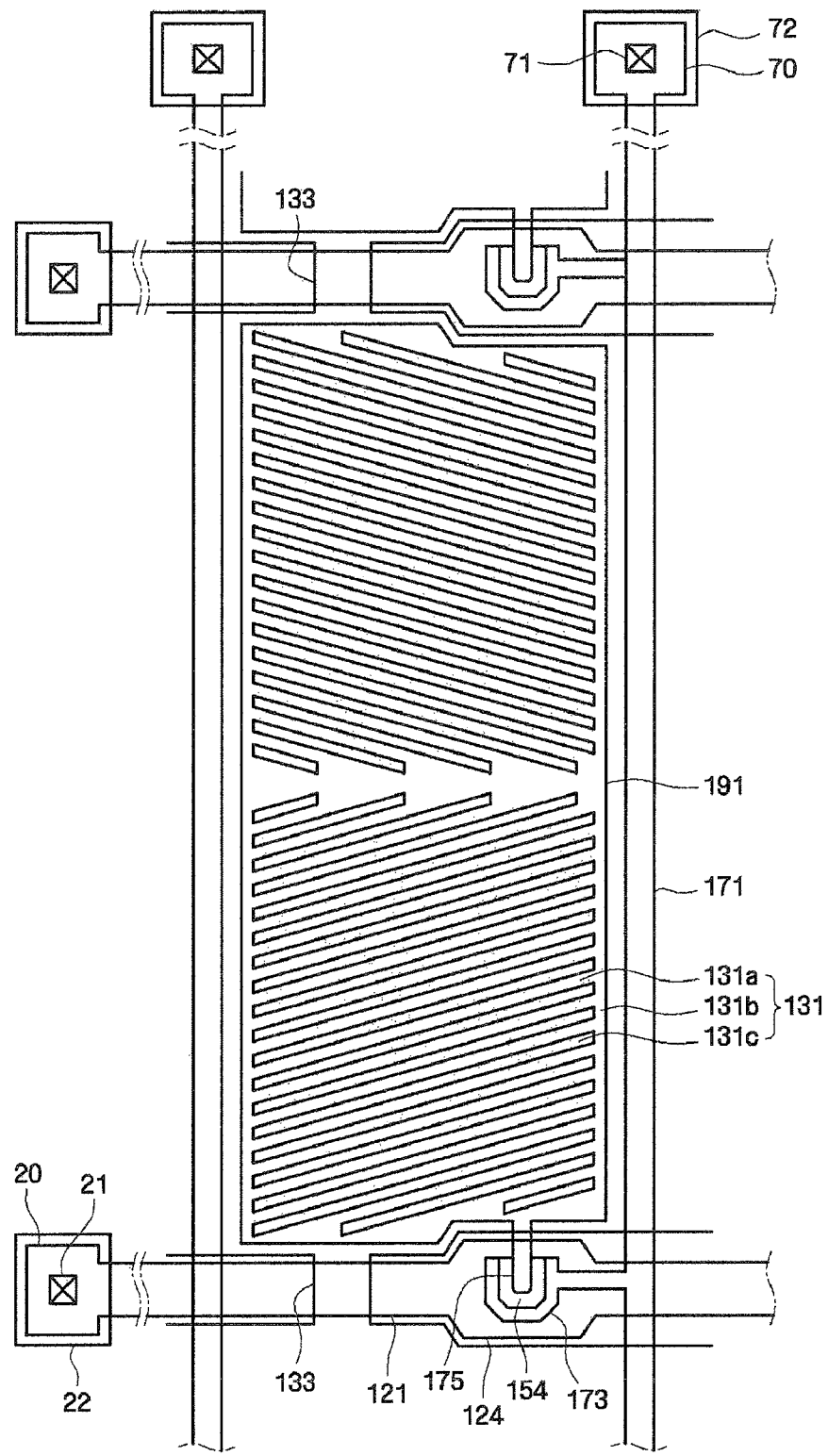
FIG. 5 is a plan view of a liquid crystal display in accordance with another embodiment.

A substrate for a thin film transistor according to a second embodiment will be described with reference to FIG. 5. FIG. 5 is a plan view of a liquid crystal display in accordance with another embodiment. In this embodiment, the same reference numbers will be used for elements and features having like structure and function, and the differences from the first embodiment will be described.

The common electrode 131 is disposed on the data lines 171, the common electrode 131 may shield the electric field produced by the data lines by covering the data lines with the common electrode.

It should be understood that the present invention is not limited to the embodiments described above. For example, the common electrode 131 may be formed substantially entirely to connect to each other by not using a second connection portion 133. In this example, the common electrode 133 may be formed on the gate lines 121, and the common electrode may shield the gate lines 121.

Although some embodiments of the present invention have been described hereinabove, it should be understood that the present invention is not limited to these embodiments, but may be modified by those skilled in the art without departing from the spirit and scope of the present invention, as defined in the appended claims.

What is claimed is:

1. A liquid crystal display (LCD) comprising:
   a substrate;
   a gate line disposed on the substrate and extending in a first direction;
   a data line extending in a second direction intersecting the first direction;
   a thin film transistor including a channel region formed in a central portion of the thin film transistor and a drain electrode;
   a first passivation layer disposed on the data line;
   a pixel electrode disposed on the first passivation layer and contacting the drain electrode;
   a second passivation layer disposed on the pixel electrode; and
   a common electrode disposed on the second passivation layer, wherein the first passivation layer is not disposed on the channel region.

2. The LCD of claim 1, wherein the thin film transistor includes:
   a gate electrode extending from the gate line;
   a gate insulating layer disposed on the gate electrode;
   a semiconductor pattern disposed on the gate insulating layer and overlapping the gate electrode; and
   a source electrode divided from the data line,
   wherein the drain electrode is disposed on the semiconductor pattern facing the source electrode.

3. The LCD of claim 1, wherein the drain electrode is contacted by the second passivation layer and is contacted by the pixel electrode.

4. The LCD of claim 1, wherein one of the pixel electrode and the common electrode includes a planar shape, and the other one of the pixel electrode and the common electrode includes a plurality of linear electrodes and at least one connection portion connecting the plurality of linear electrodes, the planar shape including no openings and being wider than at least two linear electrodes of the plurality of linear electrodes.

5. The LCD of claim 4, wherein the plurality of linear electrodes is slanted to the gate line.

6. The LCD of claim 5, wherein the plurality of linear electrodes is disposed symmetrically about a center line parallel to the gate line.

7. The LCD of claim 1, wherein the common electrode shields the data line.

8. The LCD of claim 1, wherein the common electrode is connected to a neighboring common electrode of a neighboring pixel through a connection portion.

9. The LCD of claim 1, wherein the common electrode includes a substantially planar shape with a plurality of openings.

10. The LCD of claim 1, further comprising:
    a storage line formed in a same layer with the gate line or the data line and electrically connected to the common electrode.

11. The LCD of claim 1, wherein the common electrode includes a branch electrode overlapping the pixel electrode.

12. The LCD of claim 1, wherein the pixel electrode and the drain electrode contact with each other on the gate electrode.

13. The LCD of claim 1, further comprising a sub-source electrode on the source electrode, wherein the sub-source electrode is on the same level with the pixel electrode.

14. The LCD of claim 13, wherein the contact width between the sub-source electrode and the source electrode is the same as the contact width between the pixel electrode and the drain electrode.

15. The LCD of claim 13, wherein the sub-source electrode contacts with the source electrode.

16. The LCD of claim 1, wherein the common electrode and the gate line have a first overlap portion.

17. A liquid crystal display (LCD) comprising:
    a substrate;
    a gate line disposed on the substrate and extending in a first direction;
    a data line extending in a second direction intersecting the first direction;
    a thin film transistor including a channel region formed in a central portion of the thin film transistor and a drain electrode;
    a first passivation layer disposed on the data line;
    a pixel electrode disposed on the first passivation layer and contacting the drain electrode;
    a second passivation layer disposed on the pixel electrode, wherein the drain electrode contacts the second passivation layer and contacts the pixel electrode; and
    a common electrode disposed on the second passivation layer, wherein the common electrode includes a branch electrode overlapping the pixel electrode.

18. The LCD of claim 17, wherein the pixel electrode and the drain electrode contact with each other on the gate electrode.

19. A liquid crystal display (LCD) comprising:
    a substrate;
    a gate line disposed on the substrate and extending in a first direction;
    a data line extending in a second direction intersecting the first direction;
    a thin film transistor including a channel region formed in a central portion of the thin film transistor and a drain electrode;
    a first passivation layer disposed on the data line;

a pixel electrode disposed on the first passivation layer and contacting the drain electrode; and a second passivation layer disposed on the pixel electrode, wherein the pixel electrode is disposed between the first passivation layer and the second passivation layer.

20. The LCD of claim 19, further comprising:

a common electrode disposed on the second passivation layer, wherein the common electrode includes a branch electrode overlapping the pixel electrode, and wherein the drain electrode contacts the second passivation layer and contacts the pixel electrode.

21. The LCD of claim 20, wherein the common electrode includes a branch electrode overlapping the pixel electrode.

22. The LCD of claim 19, further comprising a sub-source electrode on the source electrode, wherein the sub-source electrode is on the same level with the pixel electrode.

23. The LCD of claim 20, wherein the common electrode shields the data line.

24. The LCD of claim 20, wherein the common electrode and the gate line have a first overlap portion.

25. The LCD of claim 24, wherein the first overlap portion is across the gate line.

26. The LCD of claim 24, wherein the common electrode and the data line have a second overlap portion.

27. The LCD of claim 26, wherein the second overlap portion is across the data line.

28. The LCD of claim 16, wherein the first overlap portion is across the gate line.

29. The LCD of claim 1, wherein the common electrode and the data line have a second overlap portion.

30. The LCD of claim 29, wherein the second overlap portion is across the data line.

* * * * *